(12) United States Patent
Itskovich et al.

(10) Patent No.: US 7,769,799 B2
(45) Date of Patent: Aug. 3, 2010

(54) DISCRETE-TIME ANALOG, DIGITALLY PROGRAMMABLE FILTER AND METHOD

(75) Inventors: Mikhail Itskovich, Columbia, MD (US); Daniel J. Meyer, Woodstock, MD (US)

(73) Assignee: Atmel Corporation, San Jose, CA (US)

( * ) Notice: Subject to any disclaimer, the term of this patent is extended or adjusted under 35 U.S.C. 154(b) by 1004 days.

(21) Appl. No.: 11/128,989

(22) Filed: May 13, 2005

(65) Prior Publication Data

US 2006/0256906 A1  Nov. 16, 2006

(51) Int. Cl.
*G06G 7/02* (2006.01)
(52) U.S. Cl. .................. 708/819; 708/300; 375/350
(58) Field of Classification Search ................ 708/819, 708/300; 375/350
See application file for complete search history.

(56) References Cited

U.S. PATENT DOCUMENTS

| | | | | | |
|---|---|---|---|---|---|
| 3,919,537 | A | * | 11/1975 | Bynum ..................... | 708/822 |
| 4,356,464 | A | * | 10/1982 | Fettweis .................... | 333/173 |
| 4,816,700 | A | | 3/1989 | Imel | |
| 5,023,893 | A | | 6/1991 | Leung et al. | |
| 5,706,222 | A | * | 1/1998 | Bonaccio et al. ............ | 708/841 |
| 6,154,017 | A | | 11/2000 | Contreras | |
| 6,166,971 | A | | 12/2000 | Tamura et al. | |
| 6,332,004 | B1 | | 12/2001 | Chan | |
| 6,553,398 | B2 | | 4/2003 | Capofreddi | |
| 6,621,330 | B1 | | 9/2003 | Jaussi et al. | |
| 7,051,063 | B2 | * | 5/2006 | Kaczynski et al. .......... | 708/819 |

| | | |
|---|---|---|
| 2002/0125933 | A1 | 9/2002 Tamura et al. |
| 2003/0207679 | A1 | 11/2003 Kaczynski et al. |
| 2004/0070442 | A1 | 4/2004 Jaussi et al. |

FOREIGN PATENT DOCUMENTS

| | | |
|---|---|---|
| TW | 200401501 | 1/2004 |
| WO | WO-2006/124499 A2 | 11/2006 |

OTHER PUBLICATIONS

"International Application Serial No. PCT/US2006/018205, International Search Report mailed Jun. 12, 2008", 1 pg.
"International Application Serial No. PCT/US2006/018205, International Preliminary Report on Patentability mailed Apr. 2, 2009", 7 pgs.
"Taiwanese Application Serial No. 095116814 , Search Report mailed Aug. 3, 2009", (w/ English Translation), 5 pg.
"Taiwanese Application Serial No. 095116814 , Response filed Sep. 29, 2009", 2 pgs.
"Taiwanese Application Serial No. 095116814, Office Action issued Jul. 2, 2009", (w/ English Translation), 7 pgs.
"Taiwanese Application Serial No. 095116814, Response filed Sep. 30, 2009 to Office Action issued Jul. 2, 2009", (w/ English Translation), 3 pgs.

* cited by examiner

*Primary Examiner*—Lewis A Bullock, Jr.
*Assistant Examiner*—Michael Yaary
(74) *Attorney, Agent, or Firm*—Schwegman, Lundberg & Woessner, P.A.

(57) ABSTRACT

Aspects provide discrete-time analog, digitally programmable filtering. A filter includes a plurality of transistors coupled as a current mode circuit. Further included is a switch for use in switching the plurality of transistors in and out to tune the current mode circuit, wherein adjustable low bandwidth filtering using small silicon area without passive components is achieved.

17 Claims, 1 Drawing Sheet

DISCRETE-TIME ANALOG, DIGITALLY PROGRAMMABLE FILTER AND METHOD

FIELD OF THE INVENTION

The present invention relates to a discrete-time analog, digitally programmable filter.

BACKGROUND OF THE INVENTION

The loop filter in a PLL (phase-locked loop) is perhaps one of the most crucial pieces as it is effectively the 'brains' of the PLL. The performance of the loop filter is a trade-off between locking time and noise rejections. In an ideal world, all sources of noise in the PLL would be understood and characterized. The designer can select a cutoff frequency for the loop filter that allows the PLL to minimize noise or can allow more noise but provide faster lock times.

Unfortunately, in practice, noise sources are very difficult to understand and characterize. Often the designer may have to deal with not just the 'natural' noises (thermal, shot, flicker, etc.) inherent in any device, but also noise coupled into the circuit from outside sources. Therefore, it may be desirable to adjust the loop filter after manufacture. While this may not be particularly difficult for PLLs with lumped-element filters mounted on a printed circuit board (PCB), it's quite difficult if the filter is inside an integrated circuit. Worse, high quality integrated capacitors can be very space consuming and process variations may lead to inaccurate capacitance values.

External loop filters have very significant drawbacks as well. Driving signals off chip requires a great deal of power because of the added package parasitics. The same package parasitics which increase power consumption also complicate the analysis, since the parasitics vary with the package and PCB layout. The leads and bond wires used to bring the signal off the chip act as antennae and can actually couple additional noise into the circuit. Careful PCB layout techniques will mitigate this but never truly resolve the problem.

Other alternatives to the continuous time filters (both on and off chip) are discrete time filters, both analog and digital. While a digital filter is very attractive from a performance point of view, they aren't compact and the designer is left with a digital output which isn't adequate for driving a voltage (or current) controlled oscillator (VCO). Some sort of digital/analog conversion is required and that inherently requires an additional filter on the output, which leads back to the need for a high-performance on-chip analog filter. One nice aspect of discrete time filters, whether they be digital or analog, is decimation. The filtering action is dependent on the ratio of the sampling frequency to the input frequency. After the input signal has been filtered through one stage of the filter, the sampling frequency can be cut down and a second stage of filtering can be employed to dramatically decrease the cut-off frequency.

Creation of low bandwidth, low noise filters for silicon control systems face many difficulties. Passive low bandwidth filters require large components to be placed on the board, which is subject to additional cost and inductive noise sensitivity. On-chip passive filters require large areas and suffer from capacitive noise sensitivity. Active filters are not very successful at reducing area. Switched capacitor filters can be small, but they inject switching noise intolerable for high precision applications.

Accordingly, a need exists for a flexible, tunable, and high performance discrete time analog filter that can be manufactured on-chip. The present invention addresses such a need.

BRIEF SUMMARY OF THE INVENTION

Aspects of discrete-time analog, digitally programmable filtering are described. The filter includes a plurality of transistors coupled as a current mode circuit. Further included is a switch for use in switching the plurality of transistors in and out to tune the current mode circuit, wherein adjustable low bandwidth filtering using small silicon area without passive components is achieved.

The present invention combines discrete time filtering techniques with analog gain and high speed sampling to achieve a silicon implementation of a compact variable-bandwidth attenuation filter without the use of passive devices or discrete off-chip components. These and other advantages of the aspects of the present invention will be more fully understood in conjunction with the following detailed description and accompanying drawings.

DETAILED DESCRIPTION OF THE INVENTION

Figure 1A:
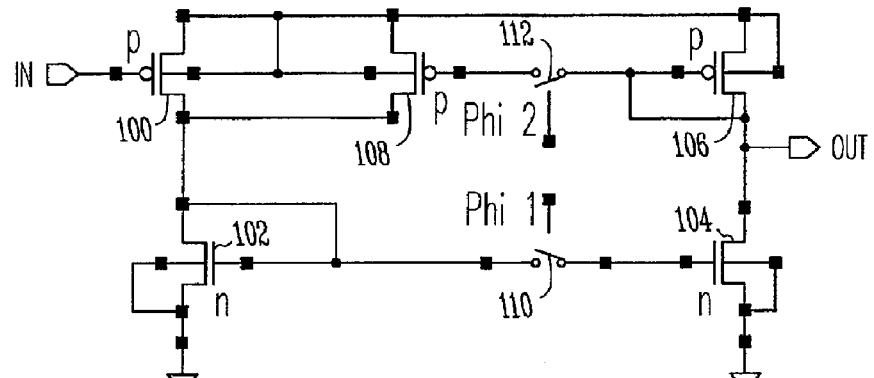
FIGS. 1a, 1b, and 1c illustrate circuit diagrams for realizing a preferred filter circuit in accordance with the present invention.

The present invention relates to a discrete-time analog, digitally programmable filter. The filter finds particular application as a loop filter for a PLL-based frequency synthesizer but is not restricted to such end use and other uses are within the spirit and scope of the present invention. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

In providing a discrete-time analog, digitally programmable filter, several considerations are made, as described in the following discussion. In accordance with the present invention, the filter acts in discrete time and uses a relatively simple algorithm:

$$Yi = (a*Y_{i-1} + b*Xi)/c$$

where Yi is the output at time i, and Xi is the input at time i. This is the most basic form of a first order low-pass infinite impulse response (IIR) filter. In the steady state DC response, both Y and X are constant over time, hence Xi=X and Yi=Yi−1:

$$Y = (aY + bX)/c \text{ or } Y/X = b/(c-a)$$

Hence, for unity gain, Y/X=1, then c=a+b, which is rather intuitive since this is essentially the weighted average of two values.

Analysis of the circuit continues with the bilinear transformation: $s = (1-z^{-1})/(1+z^{-1})$ or $z^{-1} = (1-s)/(1+s)$ and a consideration of the transfer function in the z-domain:

$Y=(aYz^{-1}+bX)/c$ $Y/X=H(z)=b/(c-az^{-1})$

H(s) is found by substituting:

$H(s)=b/(c-(a*(1-s)/(1+s))=(b*(1+s))/(s(a+c)+(c-a))$ $H(s)=b/(a+c)*(1+s)/(s+(c-a)/(c+a))$

Both the expected pole at $$\frac{-(c-a)}{(a+c)},$$

as well as a zero at s=−1. 'a' and 'c' should be selected so as to ensure that there is adequate separation so that the zero's effect on the filter is negligible and can be ignored.

To solve, the square of the magnitude of both sides is taken, and H(s)|² is set equal to 0.5 (i.e., the magnitude squared should be reduced to 0.5 at the cutoff frequency). Since, most likely, 3 dB down from the dc gain is desired at this point, 0 is substituted for s, and a determination of how much H(s) has to be multiplied by to get unity at DC occurs by performing: b/(a+c)*(a+c)/(c−a), yielding b/(c−a) (note, this is the same as the previously solved steady state solution). Normalizing the H(S) term by (c−a)/b before squaring results in:

$(0.5*(c-a)^2)/b^2=(b^2/(a+c)^2*(1+S^2))/(S^2+(c-a)^2/(c+a)^2)$ where S=tan ((Pi*fc)/fs). Since the design is underconstrained, assertions are made about two of the variables and then the third variable is calculated. If an assertion is made that unity at DC is wanted, then c=a+b. By also asserting b=1, the circuit is simplified by only requiring two multiplications, not three. Solving for 'a' by substituting c=a+1 and b=1 simplifies the equation as:

$0.5=(1/(2a+1)^2*(1+S^2))/(S^2+1/(2a+1)^2)$ $a=-0.5+/-(0.5+S^2)^{0.5}/(2^{0.5}*S)$

For practical considerations, 'a' must be a positive number, and with an assumption of a minimum oversampling rate of 2:1 (mandated by Nyquist's criterion) 'a' can be simplified to:

$a=(0.5+S^2)^{0.5}/(2^{0.5}*S)-0.5$

Performance is not identical to that of a standard filter as the oversampling ratio starts to decrease. The magnitude decreases by roughly 20 dB per decade as would a normal continuous time filter, but the phase shift should be approximately 90 degrees at low oversampling ratios. Instead, the phase shift turns around and head backs towards 0.

While the above-mentioned assertions (c=a+b and b=1) are excellent in the digital world, they may not be the best choices in the imperfect analog world. Thus, actual realization of the circuit will play a large part in choosing of the optimal parameters.

In realizing the circuit, FIG. 1a presents an initial circuit that is entirely current mode with both current input and output. As shown, the circuit includes five transistors, 100, 102, 104, 106, and 108 (without tunability), and two switches, 110 and 112. The switches 110, 112 are driven by a 2-phase non-overlapping clock. Tunability occurs by simply switching in and out binary weighted current mirrors or by adjusting the clock frequency.

Looking at the current flow, current is mirrored into the circuit through transistsor 100. Transistor 102 is a diode-connected current-follower for transistor 100. Transistor 102 mirrors current over to transistor 104 (with some gain). Transistor 106 is another diode-connected transistor which follows transistors 104, and 108 is a mirror of transistor 106 (with some gain constant). The transistor of 108/106 ratio is 'a' and the transistor of 102/104 ratio is 'c'. The ratio of transistor 100 with its mirror (106) is 'b'.

The use of switches is critical. By way of example, consideration is made of the behavior of the circuit as it applies to a step function starting from an initial condition of output and input=0. A current of X is imposed on transistor 100. Switch 110 starts out closed and switch 112 is initially open. Placing switch 112 between the drain of 104 and 106 means that even when switch 112 is switched open, current can still flow into the drain of transistor 106 (and hence the gate) charging it up, resulting in undesirable transients when switch 112 is open. The current through transistor 108 is 0, the current through transistors 100 and 102 is X. The current through 104 would be X/c if 106 allowed it, but since switch 112 is open, transsistsor 102 is still providing 0. Now, switch 110 opens and switch 112 closes. Current through transistors 102 and 104 is now equal to X/c and current through 108 is X*a/c. The X current imposed on transistor 100 remains unchanged, and switch 110 closes. As time continues X*(1+a/c) is imposed on the input, and it is seen that the transient eventually converges on a steady state solution.

Figure 1B:
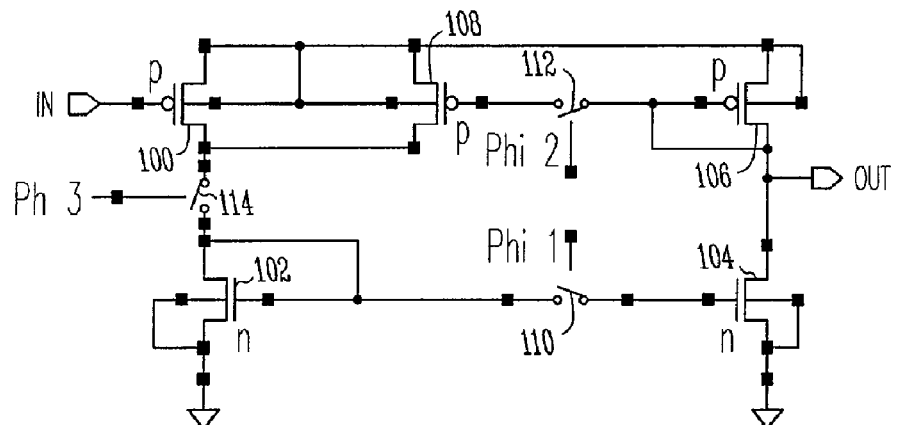

This means that peak current in the circuit is (a+2)*output current. In accordance with the present invention, a third switch 114 is introduced into the feedback path (drain of transistor 102), as shown by the circuit diagram of FIG. 1b. Switch 114 only has to be closed while switch 110 is closed. It is worth pointing out, however, that since transistor 102 is diode-connected, opening switch 114 will cause the gate to discharge itself. Thus, it is important to make sure switch 114 is closed prior to switch 110 closing with enough time for the gate voltage to stabilize at the correct value. Clearly, it is desirable to run switch 110 and switch 114 at a low duty cycle in order to conserve power.

While the circuit operates in an effective manner, it is oftentimes desirable to improve its performance. Accordingly, even with a carefully designed switch in accordance with a Figure, charge injection can effect the performance of the filter. Charge is added to the gate which causes a non-linear increase in current which is then multiplied and fed back. Even the most optimistic simulations with perfect transistor matching show that the filter circuit does not meet performance objectives optimally.

Figure 1C:
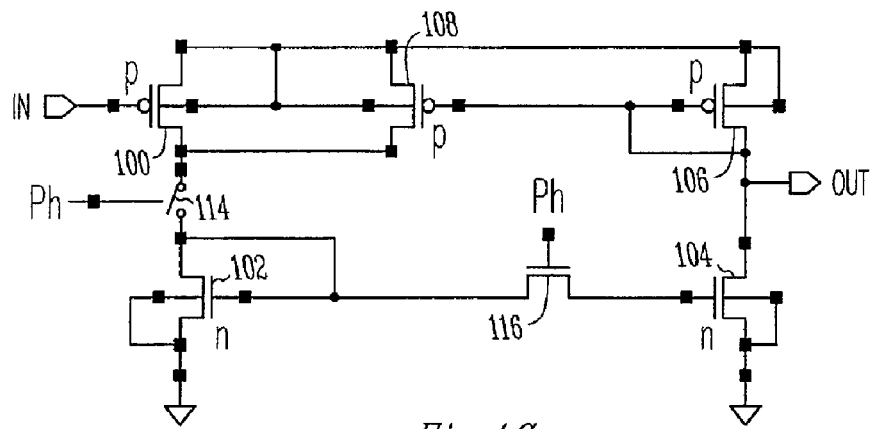

Thus, as shown in FIG. 1c, a preferred embodiment of the circuit is presented that mitigates the problems caused by charge injection. Instead of using a non-overlapping clock to control multiple switches, a single N-channel transistor 116 replaces switch 110, and switch 112 is eliminated. Preferably, transistor 116 is of minimum size in order to minimize charge injection and is driven by a clock with an ultra-low duty cycle (pulse width of about 150 picoseconds. Such a short pulse width ensures that by the time the output changes are propagated back to the input, transistor 116 is turned off again, thus eliminating the need for switch 112. The ultrashort signal could be generated using a D flip-flop, with the Q' pin tied back to an asynchronous reset (using capacitance as needed to slow the reset down) and the D pin tied high, as is well understood to those skilled in the art.

With this ultra-low duty cycle, the net amount of charge injected is the same regardless of the magnitude of the current, and net charge is of primary concern, not current. Charge, ideally, is injected equally and oppositely when the transistor 116 is turned on and then later when its turned off.

In theory, it would seem as if these charges should cancel, however, they do not. The problem is that the diode connected 104 allows current to flow into and out of the gate of 106 when transistor 116 is conducting. As a result, after a "period of time" of transistor 104 cancels out the charge injected by 116 turning on. When transistor 116 is shut off, it injects the equal and opposite charge back into both sides (the gates of 104 and 106). 104 again neutralizes the injected charge on the gate of 104 but since 116 is now shut off, it can no longer neutralize the charge on the gate of 106 (where the injected charge could actually cause an error). The ultrashort duty cycle, potentially coupled with some series resistance, prevents 104 from getting the chance to neutralize the initial injection, so the charge injected when shutting off the transistor significantly cancels the initial charge. The ultrashort pulse widths may create noise, but the noise is at extremely high frequencies and easily filtered by even normal parasitic capacitance. Not only does this modification improve immunity to charge injection noise, but it also allows much better filtering with decreased size and current.

For the situation of utilizing the circuit of FIG. 1c in a PLL, the following considerations are made. While the current-mode nature of the device (coupled with high 'a' or 'c' coefficients) can lead to high current draws, it does allow the filter to be easily cascaded to increase the number of poles and get high order filters. This may allow lower current with a sharper roll-off as long as the cut-off frequency is pushed further away from DC. This can be further exploited by decimating the sampling clock. Since the filter is low-pass, the output of the filter should have less high-frequency components than the input, and as a result, the sample rate of any future stage can be reduced without causing any problems with aliasing.

With regard to the current-output phase detector, a standard phase-frequency detector running its output into a charge pump will not work with this loop filter because of its discrete-time nature. In theory, it should be possible to create a proportional output phase detector which has some sort of time->current converter. A charge pump could charge a resettable capacitor (i.e., a capacitor that is shunted by a MOSFET) which then drives a voltage->current converter (standard op-amp/FET/resistor configuration).

Although the above works effectively, a simpler alternative can be provided. The simpler alternative comprises three D flip-flops can be arranged so that the first one is clocked by the rising edge of the reference clock, the second is clocked by the falling edge of the reference clock, and the third is clocked by the divider output clock. The third flip-flop data line is hooked to the output of the second flip-flop. The first and second flip-flop data lines are hooked to VDD. The output of the first flip-flop is hooked to asynchronous reset lines on the first and second flip-flops. The output of the third flip-flip can turn on and off a current supply feeding the filter.

In this manner, the discrete time filter realized by the present invention is successfully utilized in a PLL. The discrete time filter is a combination of efficient techniques. It performs discrete time filtering and sample decimation in addition to switched and capacitive attenuation. It provides very low effective charge injection to allow discrete time analog operation. Not only does the ultrashort pulse width switch transistor improve noise rejection and linearity, it also pulls the pole much closer to DC, while not affecting the zero. Since the zero is an undesirable side-effect of the circuit topology it is a fortuitous side-effect that the increased separation effectively eliminates the impact of the zero on the transfer function.

Good performance is achieved and the circuit is compact relative to integrated passive alternative. The circuit works well even with lower input currents, and despite the seemingly high current consumption, it is likely to be substantially lower than if external components were used. The circuit can be tuned either by changing the sampling frequency or by adjusting the transistor sizes with switches, the former preferable to the latter since it requires no additional changes to the circuit. In the case of a PLL-based frequency synthesizer, the frequency can be derived either directly or through division from the pre-divided reference frequency. Thus, the combined effect is adjustable low bandwidth, small silicon area, with no passive components on or off chip.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

We claim:

1. A filter comprising:
   a first transistor being a p-channel transistor including a source, a drain coupled to a first switch, and a gate coupled to receive an input signal;
   a second transistor that is a current follower of the first transistor, the second transistor being an n-channel transistor including a drain coupled to the first switch, the first switch to couple the drain of the second transistor to the drain of the first transistor in response to a first control signal, the second transistor including a source coupled to a ground voltage reference, and a gate coupled to a second switch and to the first switch;
   a third transistor being an n-channel transistor including a drain, a gate coupled to the second switch, and a source coupled to the ground voltage reference;
   a fourth transistor coupled as a current follower of the third transistor, the fourth transistor being a p-channel transistor including a source coupled to the source of the first transistor, a gate, and a drain coupled to the gate of the fourth transistor and to the drain of the third transistor to generate an output signal at the drain of the third transistor;
   a fifth transistor coupled to the first transistor and the fourth transistor, the fourth transistor to mirror current of the first transistor and the fifth transistor to mirror current of the fourth transistor, the fifth transistor being a p-channel transistor including a source coupled to the source of the first transistor and the source of the fourth transistor, a drain coupled to the drain of the first transistor, and a gate coupled to the gate of the fourth transistor; and
   wherein the second switch is coupled between the gate of the second transistor and the gate of the third transistor to couple the second transistor to the third transistor in response to a second control signal to modulate the output signal based on current in the first transistor and the second transistor.

2. The filter of claim 1, wherein the second control signal comprises a periodic signal having an ultra-low duty cycle.

3. The filter of claim 1, wherein the first switch is to be closed when the second switch is closed.

4. The filter of claim 1, wherein the first switch is to couple the first transistor to the second transistor in response to an ultra-low duty cycle signal.

5. The filter of claim 1, wherein the second switch comprises a single transistor that is driven by a periodic signal with an ultra-low duty cycle.

6. The filter of claim 5, wherein the single transistor comprises an N-channel transistor.

7. The filter of claim 5, wherein the ultra-low duty cycle has a pulse width of approximately 150 picoseconds or less.

8. A method comprising:
drawing current through an input circuit in response to an input signal, the input circuit including:
a first transistor being a p-channel transistor including a source, a drain coupled to a first switch, and a gate coupled to receive the input signal; and
a second transistor that is a current follower of the first transistor, the second transistor being an n-channel transistor including a drain coupled to the first switch, the first switch to couple the drain of the second transistor to the drain of the first transistor in response to a first control signal, the second transistor including a source coupled to a ground voltage reference, and a gate coupled to a second switch and to the first switch;
coupling the input circuit to an output circuit through the second switch in response to a second control signal to modulate current in the output circuit based on current in the input circuit, the output circuit including:
a third transistor being an n-channel transistor including a drain, a gate coupled to the second switch, and a source coupled to the ground voltage reference;
a fourth transistor coupled as a current follower of the third transistor, the fourth transistor being a p-channel transistor including a source coupled to the source of the first transistor, a gate, and a drain coupled to the gate of the fourth transistor and to the drain of the third transistor; and
a fifth transistor coupled to the first transistor and the fourth transistor, the fourth transistor to mirror current of the first transistor and the fifth transistor to mirror current of the fourth transistor, the fifth transistor being a p-channel transistor including a source coupled to the source of the first transistor and the source of the fourth transistor, a drain coupled to the drain of the first transistor, and a gate coupled to the gate of the fourth transistor; and
generating an output signal at the drain of the third transistor from the current in the output circuit.

9. The method of claim 8, wherein coupling the input circuit to an output circuit includes coupling the input circuit to the output circuit through the second switch in response to a periodic signal.

10. The method of claim 9, wherein the periodic signal has an ultra-low duty cycle.

11. The method of claim 10, wherein the ultra-low duty cycle has a pulse width of approximately 150 picoseconds or less.

12. The method of claim 8, wherein coupling the input circuit to an output circuit includes coupling the input circuit to the output circuit through a switch transistor in response to the second control signal.

13. The method of claim 8, wherein drawing current though an input circuit includes:
drawing current through the input circuit in response to the input signal being coupled to the gate of the first transistor;
drawing the current in the input circuit through the second transistor coupled as a current follower of the first transistor; and
coupling the second transistor to the first transistor though the first switch in response to the first control signal when the input circuit is coupled to the output circuit through the second switch.

14. A filter comprising:
an input current follower circuit including:
a first transistor being a p-channel transistor including a source, a drain coupled to a first switch, and a gate coupled to receive an input signal; and
a second transistor that is a current follower of the first transistor, the second transistor being an n-channel transistor including a drain coupled to the first switch, the first switch to couple the drain of the second transistor to the drain of the first transistor in response to a first control signal, the second transistor including a source coupled to a ground voltage reference, and a gate coupled to a second switch and to the first switch;
an output current follower circuit including:
a third transistor being an n-channel transistor including a drain, a gate coupled to the second switch, and a source coupled to the ground voltage reference; and
a fourth transistor coupled as a current follower of the third transistor, the fourth transistor being a p-channel transistor including a source coupled to the source of the first transistor, a gate, and a drain coupled to the gate of the fourth transistor and to the drain of the third transistor to generate an output signal at the drain of the third transistor;
a fifth transistor coupled to the first transistor and the fourth transistor, the fourth transistor to mirror current of the first transistor and the fifth transistor to mirror current of the fourth transistor, the fifth transistor being a p-channel transistor including a source coupled to the source of the first transistor and the source of the fourth transistor, a drain coupled to the drain of the first transistor, and a gate coupled to the gate of the fourth transistor; and
wherein the second switch is coupled between the input current follower circuit and the output current follower circuit to couple the input current follower circuit to the output current follower circuit in response to a second control signal to modulate the output signal based on current in the input current follower circuit.

15. The filter of claim 14, wherein the second control signal has an ultrashort pulse width.

16. The filter of claim 14, wherein the first switch is to be closed when the second switch is closed.

17. The filter of claim 16, wherein the first switch is to couple the first transistor to the second transistor in response to an ultra-low duty cycle signal.

* * * * *

UNITED STATES PATENT AND TRADEMARK OFFICE
CERTIFICATE OF CORRECTION

PATENT NO. : 7,769,799 B2  
APPLICATION NO. : 11/128989  
DATED : August 3, 2010  
INVENTOR(S) : Mikhail Itskovich et al.

It is certified that error appears in the above-identified patent and that said Letters Patent is hereby corrected as shown below:

In column 3, line 67, delete "transistsor" and insert -- transistor --, therefor.

In column 4, lines 19–20, delete "transistsor" and insert -- transistor --, therefor.

In column 7, line 57, in Claim 13, delete "though" and insert -- through --, therefor.

In column 8, line 7, in Claim 13, delete "though" and insert -- through --, therefor.

Signed and Sealed this

Twelfth Day of October, 2010

David J. Kappos  
*Director of the United States Patent and Trademark Office*